United States Patent
Fan et al.

(10) Patent No.: US 10,128,234 B2
(45) Date of Patent: Nov. 13, 2018

(54) ELECTROMIGRATION RESISTANT SEMICONDUCTOR DEVICE

(71) Applicant: Taiwan Semiconductor Manufacturing Company Limited, Hsinchu (TW)

(72) Inventors: Ni-Wan Fan, Tao-yuan (TW); Sheng-Hsiung Chen, Hsinchu County (TW); Cheng-I Huang, Hsinchu (TW); Jung-Chan Yang, Taoyuan (TW); Hsiang-Jen Tseng, Hsinchu (TW); Chi-Yu Lu, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/355,137

(22) Filed: Nov. 18, 2016

(65) Prior Publication Data
US 2018/0145070 A1    May 24, 2018

(51) Int. Cl.
| | |
|---|---|
| H01L 27/088 | (2006.01) |
| H01L 21/8234 | (2006.01) |
| H01L 23/522 | (2006.01) |
| H01L 23/528 | (2006.01) |
| H01L 27/02 | (2006.01) |
| H01L 29/08 | (2006.01) |
| H01L 29/10 | (2006.01) |
| H03K 17/693 | (2006.01) |

(52) U.S. Cl.
CPC .... *H01L 27/088* (2013.01); *H01L 21/823418* (2013.01); *H01L 21/823475* (2013.01); *H01L 23/528* (2013.01); *H01L 23/5226* (2013.01); *H01L 27/0207* (2013.01); *H01L 29/0847* (2013.01); *H01L 29/1033* (2013.01); *H03K 17/693* (2013.01)

(58) Field of Classification Search
CPC ..... H01L 21/823418; H01L 21/823475; H01L 23/5226; H01L 23/528; H01L 27/0207; H01L 27/088; H01L 29/0847; H01L 29/1033; H03K 17/693
USPC ......................................... 327/564, 565, 566
See application file for complete search history.

(56) References Cited

U.S. PATENT DOCUMENTS 5,781,062 A * 7/1998 Mashiko .................. G11C 5/14
327/215
2006/0055391 A1* 3/2006 Kuang ............... H03K 19/0016
323/371

(Continued)

*Primary Examiner* — William Hernandez
(74) *Attorney, Agent, or Firm* — Jones Day (57) ABSTRACT

A semiconductor device includes first and second transistors, a pair of first source/drain regions, a pair of second source/drain regions, and a cell. Each of the first source/drain regions corresponds to a first source/drain terminal of a respective one of the first and second transistors. Each of the second source/drain regions corresponds to a second source/drain terminal of a respective one of the first and second transistors. The cell includes a first voltage rail, a pair of second voltage rails, and a cell circuit. The first voltage rail is coupled to the first source/drain regions. Each of the second voltage rails is coupled to a respective one of the second source/drain regions and is configured to be coupled to the first voltage rail. The cell circuit is coupled to one of the second voltage rails.

20 Claims, 8 Drawing Sheets

(56) References Cited

U.S. PATENT DOCUMENTS

2007/0063763 A1* 3/2007 Yoo .................... G11C 11/4074
                                                                     327/544
2009/0309418 A1* 12/2009 Motomura ........... G06F 1/3287
                                                                     307/38
2011/0102072 A1* 5/2011 Idgunji .............. H03K 19/0005
                                                                     327/540
2012/0030489 A1* 2/2012 Patil ........................ G06F 1/26
                                                                     713/323

* cited by examiner

ELECTROMIGRATION RESISTANT SEMICONDUCTOR DEVICE

BACKGROUND

A conventional standard cell library includes a plurality of layouts of standard cells, each of which includes one or more logic gates, and is used during the design of a layout of a semiconductor device, e.g., an application specific integrated circuit (ASIC). Semiconductor devices that may be fabricated from the layout are susceptible to electromigration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electromigration is a phenomenon in which ions/atoms of a metal line of a semiconductor device migrate from a first region to a second region of the metal line and involves formation of voids at the first region of the metal line, which may cause an open circuit in the semiconductor device, and accumulation of the ions/atoms at the second region of the metal line, which may cause a short circuit in the semiconductor device.

The present disclosure in various embodiments provides a semiconductor device, i.e., an integrated circuit (IC), e.g., an application specific IC (ASIC), that includes a cell, e.g., a standard cell, which mitigates electromigration in a manner that will be described in detail hereinafter. In an exemplary embodiment, the cell includes a header that has a pair of virtual source reference rails, instead of one, to improve an electromigration resistance of the semiconductor device.

Figure 1:
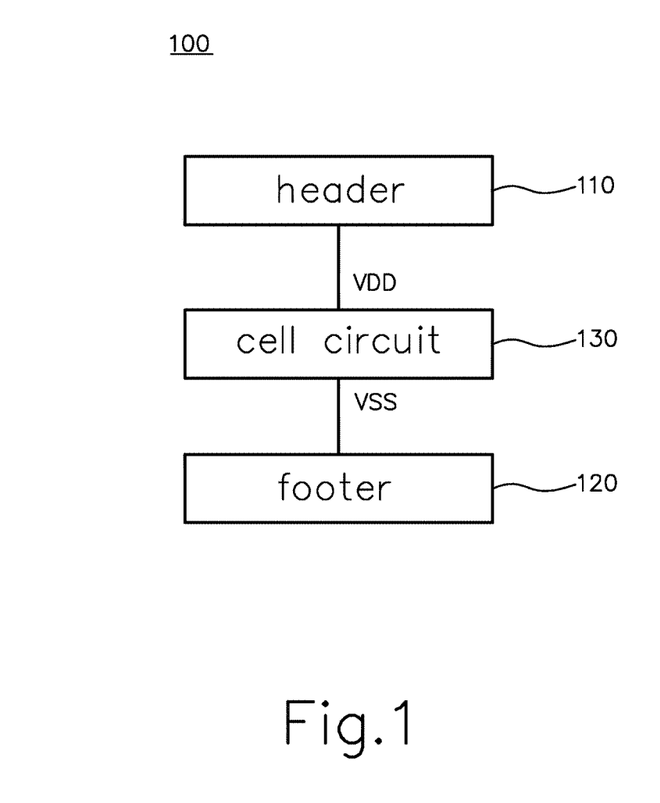
FIG. 1 is a schematic block diagram illustrating an exemplary cell of a semiconductor device in accordance with some embodiments.

FIG. 1 is a schematic block diagram illustrating an exemplary cell, e.g., a standard cell, of a semiconductor device 100 in accordance with some embodiments. The cell includes a header 110, a footer 120, and a cell circuit 130. The cell circuit 130 is connected between the header 110 and the footer 120 and is configured to perform a predetermined circuit function, which in some embodiments is a Boolean logic function. In such some embodiments, the cell circuit 130 includes a NOT gate, an AND gate, a NAND gate, an OR gate, a NOR gate, an XOR gate, an XNOR gate, another logic gate, a combination thereof, or the like. In other embodiments, the cell circuit 130 includes a logic gate and a passive/active device, e.g., a resistor, a capacitor, an inductor, a transistor, a diode, or the like.

The header 110 is configured to be connected to a power supply (not shown) external to the semiconductor device 100 and to receive a first voltage from the external power supply, whereby a first cell voltage, i.e., a source voltage (VDD), that corresponds to the first voltage is provided to the cell circuit 130 therethrough. The footer 120 is configured to be connected to the external power supply and to receive a second voltage from the external power supply, whereby a second cell voltage, i.e., a reference voltage (VSS), e.g., a ground voltage, that corresponds to the second voltage is provided to the cell circuit 130 therethrough.

Figure 2:
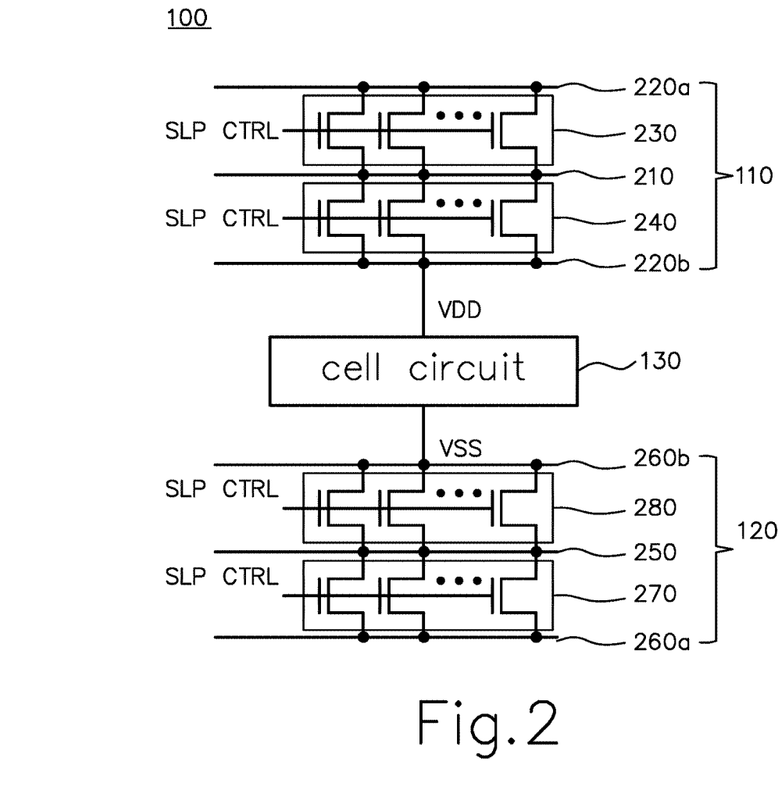
FIG. 2 is a schematic circuit diagram illustrating a header and a footer of the cell of the semiconductor device in accordance with some embodiments.

FIG. 2 is a schematic circuit diagram illustrating the header 110 and the footer 120 in accordance with some embodiments. The header 110 includes a first source voltage rail 210 that is configured to be connected to the external power supply and that is therefore termed as a true source voltage rail. The header 110 further includes second source voltage rails 220a, 220b that are configured to provide the source voltage (VDD) and that are therefore termed as virtual source voltage rails. The header 110 further includes transistor units 230, 240, each of which is configured to electrically connect a respective one of the virtual source voltage rails 220a, 220b to the true source voltage rail 210 and includes a plurality of n-channel field-effect transistors (FETs). As illustrated in FIG. 2, each of the transistors of the transistor unit 230 has a first source/drain terminal connected to the true source voltage rail 210 and a second source/drain terminal connected to the virtual source voltage rail 220a. Each of the transistors of the transistor unit 240 has a first source/drain terminal connected to the true source voltage rail 210 and a second source/drain terminal connected to the virtual source voltage rail 220b. In an alternative embodiment, each of the transistor units 230, 240 includes a single transistor.

The footer 120 includes a first reference voltage rail 250 that is configured to be connected to the external power supply and that is therefore termed as a true reference voltage rail. The footer 120 further includes second reference voltage rails 260a, 260b that are configured to provide the reference voltage (VSS) and that are therefore termed as virtual reference voltage rails. The footer 120 further includes transistor units 270, 280, each of which is configured to electrically connect a respective one of the virtual reference voltage rails 260a, 260b to the true reference voltage rail 250 and includes a plurality of n-channel FETs. As illustrated in FIG. 2, each of the transistors of the transistor unit 270 has a first source/drain terminal connected to the true reference voltage rail 250 and a second source/drain terminal connected to the virtual reference voltage rail 260a. Each of the transistors of the transistor unit 280 has a first source/drain terminal connected to the true reference voltage rail 250 and a second source/drain terminal connected to the virtual reference voltage rail 260b. In some embodiments, each of the transistor units 270, 280 includes a single transistor. In other embodiments, the footer 120 does not include, i.e., is dispensed with, the second reference voltage rail 260a and the transistor unit 270.

Each of the transistors of the transistor units 230, 240, 270, 280 further has a gate terminal connected to a sleep control node (SLP CTRL), at which a voltage signal is applied to turn on/off the transistors. In some embodiments, each of the transistors of the transistor units 230, 240, 270, 280 is a p-channel FET. In other embodiments, each of the transistors of the transistor units 230, 240, 270, 280 may be any type of transistor.

The cell circuit 130 is connected between the virtual source voltage rail 220b and the virtual reference voltage rail 260b. It should be understood that the cell circuit 130 may further be connected to at least one of the virtual source voltage rail 220a and the virtual reference voltage rail 260a.

In operation, when the voltage signal at the sleep control node (SLP CTRL) transitions from a low voltage level to a high voltage level, the transistor unit 230 electrically connects the virtual source voltage rail 220a to the true source voltage rail 210, the transistor unit 240 electrically connects the virtual source voltage rail 220b to the true source voltage rail 210, the transistor unit 270 electrically connects the virtual reference voltage rail 260a to the true reference voltage rail 250, and the transistor unit 280 electrically connects the virtual reference voltage rail 260b to the true reference voltage rail 250. This applies the source and reference voltages (VDD, VSS) to the cell circuit 130. This, in turn, enables the cell circuit 130 to perform the predetermined circuit function.

Figure 3:
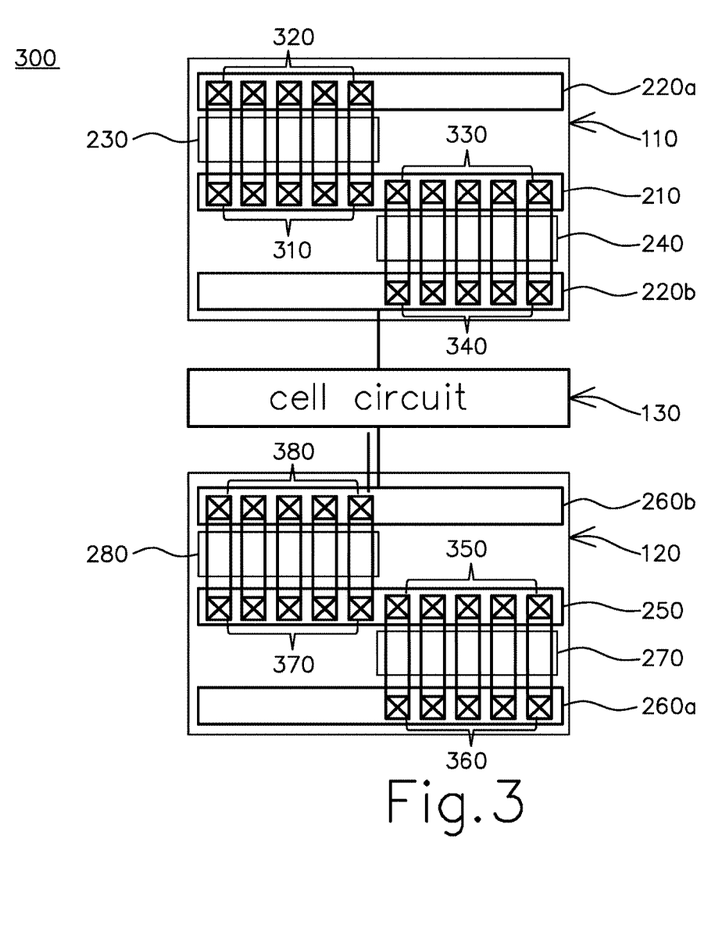
FIG. 3 is a schematic view illustrating an exemplary structure/layout of the cell in accordance with some embodiments.

FIG. 3 is a schematic view illustrating an exemplary structure/layout 300 of the cell of the semiconductor device 100 in accordance with some embodiments. The structure/layout 300 includes a header, a footer, and a cell circuit, which correspond to the header 110, the footer 120, and the cell circuit 130, respectively.

The header 110 includes a true source voltage rail, which corresponds to the true source voltage rail 210, virtual source voltage rails, which correspond to the virtual source voltage rails 220a, 220b, transistor units, which correspond to the transistor units 230, 240, and via units 310, 320, 330, 340. As illustrated in FIG. 3, the true source voltage rail 210 and the virtual source voltage rails 220a, 220b are substantially parallel to each other and have substantially the same width. In some embodiments, at least one of the true source voltage rail 210 and the virtual source voltage rails 220a, 220b is oriented in another direction, e.g., the true source voltage rail 210 is substantially perpendicular to the virtual source voltage rails 220a, 220b. In other embodiments, at least two of the true source voltage rail 210 and the virtual source voltage rails 220a, 220b have different widths.

Although the header 110 is exemplified such that the true source voltage rail 210 is between the virtual source voltage rails 220a, 220b, it will be appreciated that, after reading this disclosure, the true source voltage rail 210 and the virtual source voltage rails 220a, 220b may be arranged in any position relative to each other.

Each of the via units 310, 320, 330, 340 includes a plurality of vias. Each of the vias of the via unit 310 interconnects the true source voltage rail 210 and the first source/drain terminal of a respective one of the transistors of the transistor unit 230. Each of the vias of the via unit 320 interconnects the virtual source voltage rail 220a and the second source/drain terminal of a respective one of the transistors of the transistor unit 230. Each of the vias of the via unit 330 interconnects the true source voltage rail 210 and the first source/drain terminal of a respective one of the transistors of the transistor unit 240. Each of the vias of the via unit 340 interconnects the virtual source voltage rail 220b and the second source/drain terminal of a respective one of the transistors of the transistor unit 240.

In this exemplary embodiment, the numbers of the transistors of the transistor units 230, 240 are the same. In an alternative embodiment, the number of the transistors of the transistor unit 230 is different from, i.e., greater/less than, the number of the transistors of the transistor unit 240.

The footer 120 includes a true reference voltage rail, which corresponds to the true reference voltage rail 250, virtual reference voltage rails, which correspond to the virtual reference voltage rails 260a, 260b, transistor units, which correspond to the transistor units 270, 280, and via units 350, 360, 370, 380. As illustrated in FIG. 3, the true reference voltage rail 250 and the virtual reference voltage rails 260a, 260b are substantially parallel to each other and have the same width. In some embodiments, at least one of the true reference voltage rail 250 and the virtual reference voltage rails 260a, 260b is oriented in another direction, e.g., the true reference voltage rail 250 is substantially perpendicular to the virtual reference voltage rails 260a, 260b. In other embodiments, at least two of the true reference voltage rail 250 and the virtual reference voltage rails 260a, 260b have different widths.

Although the footer 120 is exemplified such that the true reference voltage rail 250 is between the virtual reference voltage rails 260a, 260b, it will be appreciated that, after reading this disclosure, the true reference voltage rail 250 and the virtual reference voltage rails 260a, 260b may be arranged in any position relative to each other.

Each of the via units 350, 360, 370, 380 includes a plurality of vias. Each of the vias of the via unit 350 interconnects the true reference voltage rail 250 and the first source/drain terminal of a respective one of the transistors of the transistor unit 270. Each of the vias of the via unit 360 interconnects the virtual reference voltage rail 260a and the second source/drain terminal of a respective one of the transistors of the transistor unit 270. Each of the vias of the via unit 370 interconnects the true reference voltage rail 250 and the first source/drain terminal of a respective one of the transistors of the transistor unit 280. Each of the vias of the via unit 380 interconnects the virtual reference voltage rail 260b and the second source/drain terminal of a respective one of the transistors of the transistor unit 280.

In some embodiments, the numbers of the transistors of the transistor units 270, 280 are the same. In an alternative embodiment, the number of the transistors of the transistor unit 270 is different from, i.e., greater/less than, the number of the transistors of the transistor unit 280. In other embodiments, the footer 120 is dispensed with the virtual reference voltage rail 260a and the transistor unit 270.

Figure 4:
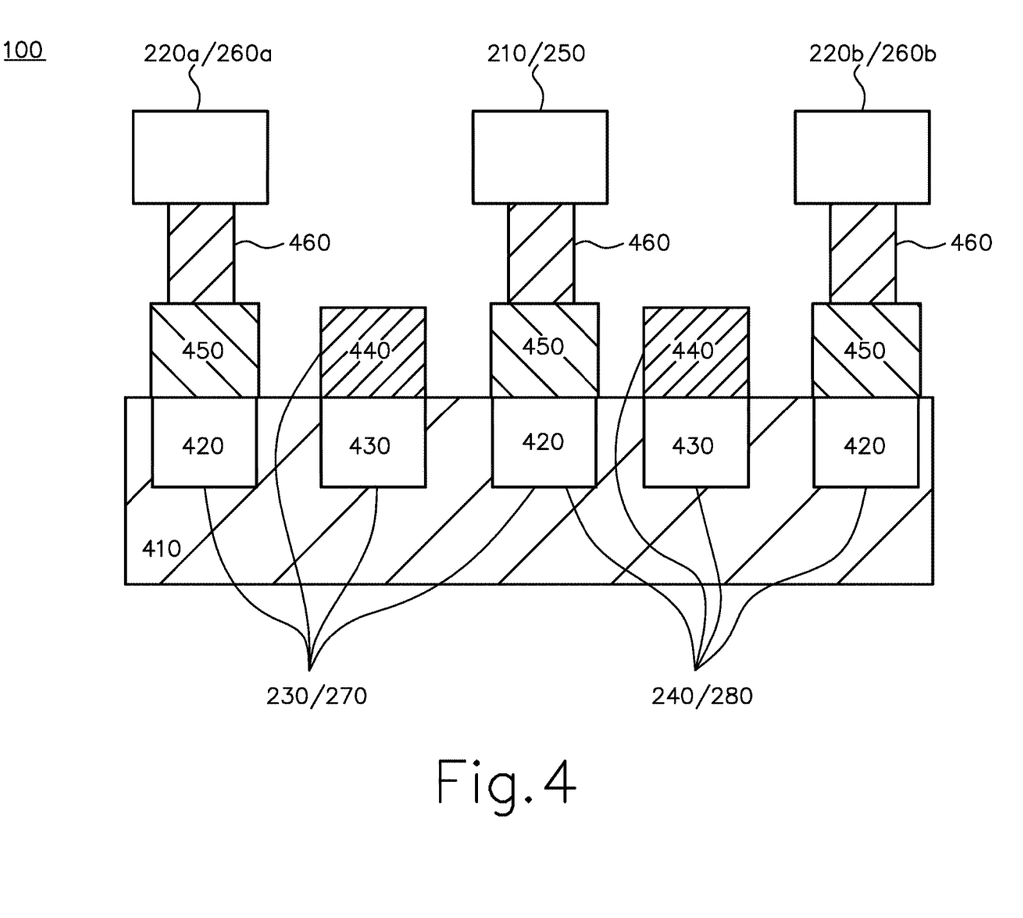
FIG. 4 is a schematic sectional view illustrating the semiconductor device in accordance with some embodiments.
Figure 5:
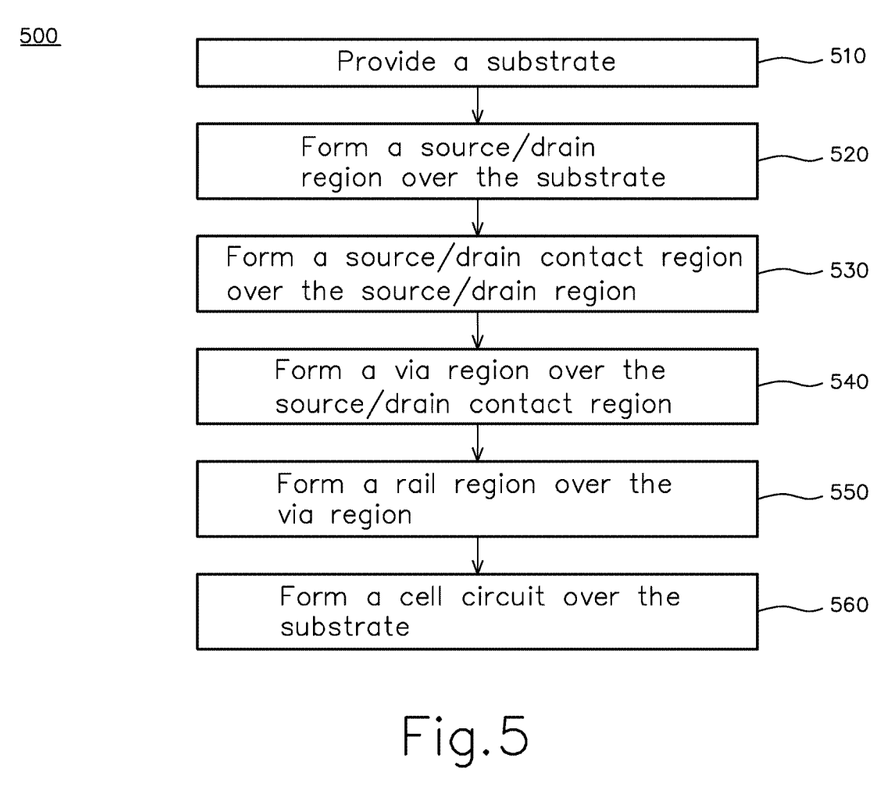
FIG. 5 is a flow chart illustrating an exemplary method for manufacturing the semiconductor device in accordance with some embodiments.

The method for manufacturing the semiconductor device 100 using the layout 300 will now be described with further reference to FIGS. 4 and 5. FIG. 4 is a schematic sectional view illustrating the semiconductor device 100 in accordance with some embodiments. FIG. 5 is a flow chart illustrating an exemplary method 500 for manufacturing the semiconductor device 100 in accordance with some embodiments. Since the operations of forming the header 110 and footer 120 are similar, only those of the header 110 will be described here.

In operation 510, a substrate 410 is provided. In some embodiments, the substrate 410 is a bulk substrate and includes silicon, germanium, another semiconductor material, such as a III-V material, or a combination thereof. In other embodiments, the substrate 410 is a semiconductor-on-insulator (SOI) substrate and includes silicon, germanium, another semiconductor material, such as a III-V material, or a combination thereof.

In operation 520, transistors of the transistor units 230, 240 are formed over the substrate 410. In some embodiments, operation 520 includes implanting first ions in the substrate 410 to form first, second, third, and fourth sets of source/drain regions 420. Each of the source/drain regions 420 in the first set corresponds to the first source/drain terminal of a respective one of the transistors of the transistor unit 230. Each of the source/drain regions 420 in the second set corresponds to the first source/drain terminal of a respective one of the transistors of the transistor unit 240. Each of the source/drain regions 420 in the third set corresponds to the second source/drain terminal of a respective one of the transistors of the transistor unit 230. Each of the source/drain regions 420 in the fourth set corresponds to the second source/drain terminal of a respective one of the transistors of the transistor unit 240. Operation 520 further includes implanting second ions in the substrate 410 to form first and second sets of channel regions 430. Each of the channel regions 430 in the first set corresponds to a channel of a respective one of the transistors of the transistor unit 230. Each of the channel regions 430 in the second set corresponds to a channel of a respective one of the transistors of the transistor unit 240. Operation 520 further includes depositing a polysilicon material over the channel regions 430 to form first and second sets of polysilicon gate regions 440. Each of the polysilicon gate regions 440 in the first set corresponds to the gate terminal of a respective one of the transistors of the transistor unit 230. Each of the polysilicon gate regions 440 in the second set corresponds to the gate terminal of a respective one of the transistors of the transistor unit 240. In this exemplary embodiment, as illustrated in FIG. 4, the transistors of the transistor units 230, 240 are planar FETs.

In an alternative embodiment, the transistors are finFETs. In such an alternative embodiment, method 500 further includes, prior to operation 520, patterning a lithographic mask over a surface of the substrate 410, etching an upper portion of the substrate 410 using the patterned lithographic mask to form a fin above a lower portion of the substrate 410, and stripping the patterned lithographic mask. Thereafter, operation 520 is performed on the fin. In certain embodiments, the polysilicon gate regions 440 are dummy gate regions. In such certain embodiments, operation 520 further includes replacing each of the polysilicon gate regions 440 in the first and second sets with a gate region that includes metal, such as, but is not limited to, copper, aluminum, titanium, tantalum, an alloy thereof, or the like.

In operation 530, a plurality of source/drain contact regions 450, each of which is formed over a respective one of the source/drain regions 420. In this exemplary embodiments, operation 530 includes: depositing a first dielectric material (not shown), e.g., silicon oxide, over the source/drain regions 420; forming a plurality of holes, each of which extends through the first dielectric layer and to a respective one of the source/drain regions 420; filling the holes with metal, such as, but is not limited to, copper, aluminum, titanium, tantalum, an alloy thereof, or the like; and annealing the metal and the source/drain regions 420.

In operation 540, a plurality of via regions 460, each of which is formed over a respective one of the source/drain contact regions 450 and each of which corresponds to a respective one of the vias of the via units 310, 320, 330, 340. In this exemplary embodiment, operation 540 includes: depositing a second dielectric material (not shown), e.g., a silicon oxide, over the source/drain contact regions 450; forming a plurality of holes, each of which extends through the second dielectric layer and to a respective one of the source/drain contact regions 450; and filling the holes with metal, such as, but is not limited to, copper, aluminum, titanium, tantalum, an alloy thereof, or the like.

In operation 550, a rail region that includes a true source voltage rail, which corresponds to the true source voltage rail 210, and virtual source voltage rails, which correspond to the virtual source voltage rails 220a, 220b, are formed over the via regions 460 such that each of a first set of the via regions 460 interconnects the true source voltage rail 210 and a respective one of a first set of the source/drain contact regions 450, such that each of a second set of the via regions 460 interconnects the virtual source voltage rail 220a and a respective one of a second set of the source/drain contact regions 450, such that each of a third set of the via regions 460 interconnects the true source voltage rail 210 and a respective one of a third set of the source/drain contact regions 450, and such that each of a fourth set of via regions 460 interconnects the virtual source voltage rail 220b and a respective one of a fourth set of the source/drain contact regions. In this exemplary embodiment, operation 550 includes depositing a third dielectric material (not shown), e.g., silicon oxide, over the via regions 460; forming a plurality of holes, each of which extends through the third dielectric layer and to a respective one of the via regions 460; and filling the holes with metal, such as, but is not limited to, copper, aluminum, titanium, tantalum, an alloy thereof, or the like.

In operation 560, a circuit region (not shown) that includes the cell circuit 130 is formed over the substrate 410.

Figure 6:
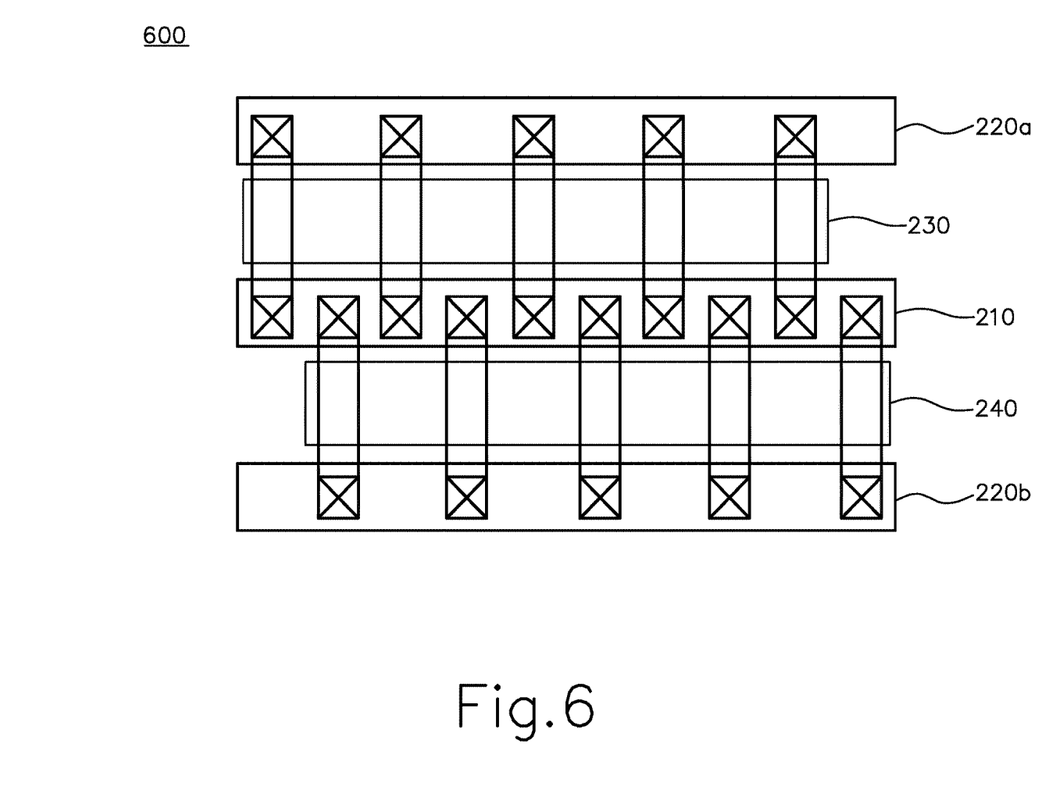
FIG. 6 is a schematic view illustrating another exemplary structure/layout of the cell in accordance with some embodiments.

FIG. 6 is a schematic view illustrating another exemplary structure/layout 600 of the cell of the semiconductor device 100 in accordance with some embodiments. Although the header 110 is exemplified such that the transistors of the transistor unit 230 are on the left side and the transistors of the transistor unit 240 are on the right side, it will be appreciated that, after reading this disclosure, the transistors thereof may be arranged in any position relative to each other. For example, as illustrated in FIG. 6, a transistor of the transistor unit 230 is between an adjacent pair of transistors of the transistor unit 240. In some embodiments, the footer 120 has a layout/structure similar to the layout/structure 600. That is, in such some embodiments, a transistor of the transistor unit 270 is between an adjacent pair of transistors of the transistor unit 280. In other embodiments, the footer 120 has a layout/structure, e.g., the layout/structure 300, different from the layout/structure 600.

Figure 7:
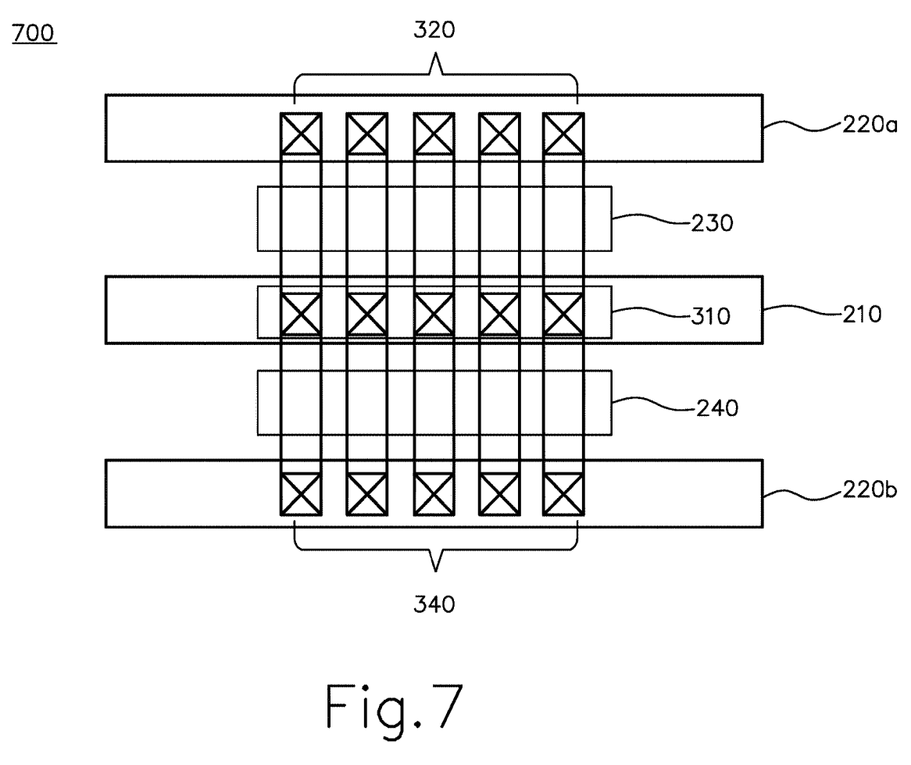
FIG. 7 is a schematic view illustrating another exemplary structure/layout of the cell in accordance with some embodiments.

FIG. 7 is a schematic view illustrating another exemplary structure/layout 700 of the cell of the semiconductor device 100 in accordance with some embodiments. This embodiment differs from the structure/layout 300 in that the structure/layout 700 is dispensed with the via unit 330. The transistor units 230, 240 of the structure/layout 700 share the via unit 310. In particular, as illustrated in FIG. 7, each of the vias of the via unit 310 interconnects the first source/drain terminal of a respective one of the transistors of the transistor unit 230, the first source/drain terminal of a respective one of the transistors of the transistor unit 240, and the true source voltage rail 210. In some embodiments, the footer 120 has a layout/structure similar to the layout/structure 700. That is, in such some embodiments, the via unit 370 is dispensed with. The transistor units 270, 280 share the via unit 350. In particular, each of the vias of the via unit 350 interconnects the first source/drain terminal of a respective one of the transistors of the transistor unit 270, the first source/drain terminal of a respective one of the transistors of the transistor unit 280, and the true reference voltage rail 250. In other embodiments, the footer 120 has a layout/structure, e.g., the layout/structure 300, different from the layout/structure 700.

Figure 8:
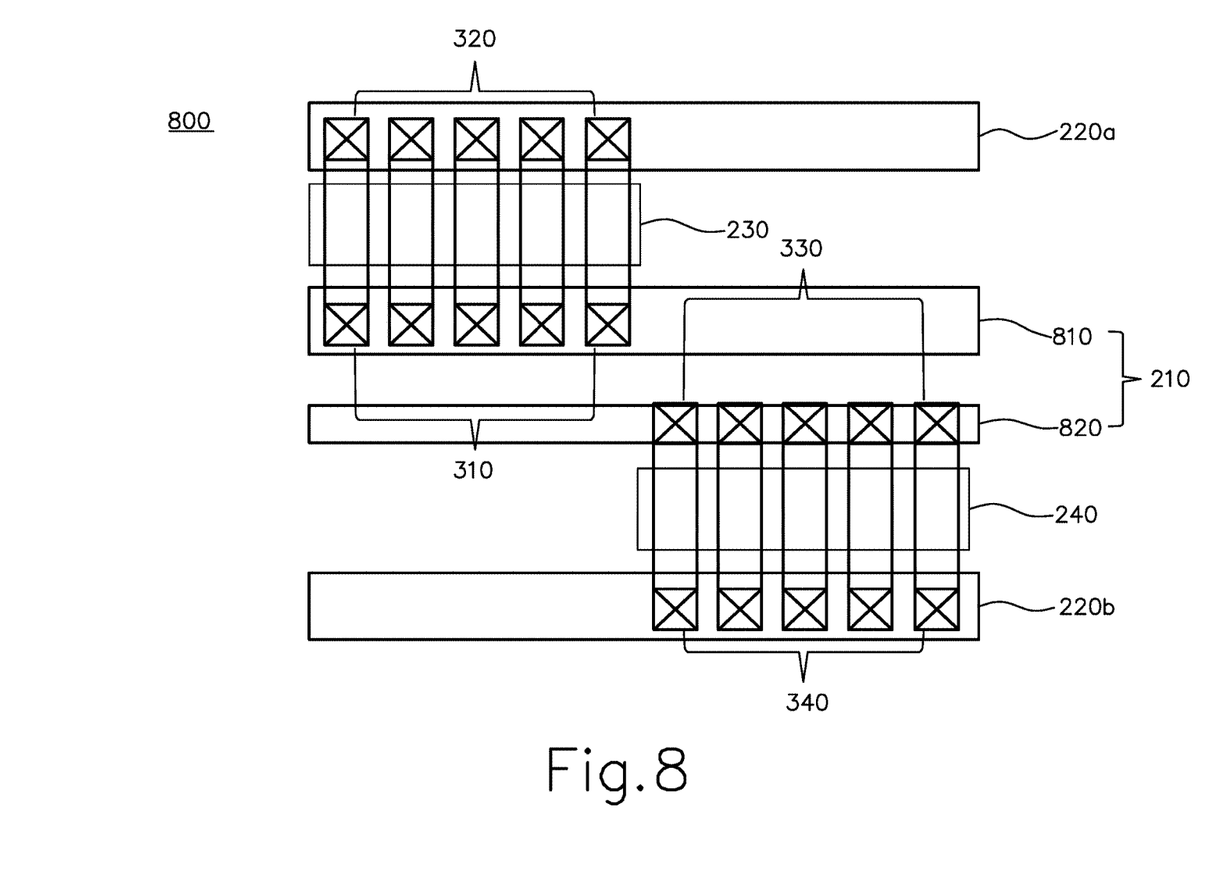
FIG. 8 is a schematic view illustrating another exemplary structure/layout of the cell in accordance with some embodiments.

FIG. 8 is a schematic view illustrating another exemplary structure/layout 800 of the cell of the semiconductor device 100 in accordance with some embodiments. This embodiment differs from the structure/layout 300 in that the true source voltage rail 210 includes a pair of strips 810, 820. Each of the vias of the via unit 310 interconnects the first source/drain terminal of a respective one of the transistors of the transistor unit 230 and the strip 810. Each of the vias of the via unit 330 interconnects the first source/drain terminal of a respective one of the transistors of the transistor unit 240 and the strip 820. In this exemplary embodiment, the sum of the widths of the strips 810, 820 is substantially equal to a width of the virtual source voltage rail 220a/220b. In an embodiment, the widths of the strips 810, 820 are substantially the same. In another embodiment, the widths of the strips 810, 820 are different. In some embodiments, the footer 120 has a layout/structure similar to the layout/structure 800. For example, in such some embodiments, the true reference voltage rail 250 includes a pair of strips. Each of the vias of the via unit 350 interconnects the first source/drain terminal of a respective one of the transistors of the transistor unit 270 and one of the strips of the true reference voltage rail 250. Each of the vias of the via unit 370 interconnects the first source/drain terminal of a respective one of the transistors of the transistor unit 280 and the other of the strips of the true reference voltage rail 250. In other embodiments, the footer 120 has a layout/structure, e.g., the layout/structure 300, different from the layout/structure 800.

Figure 9:
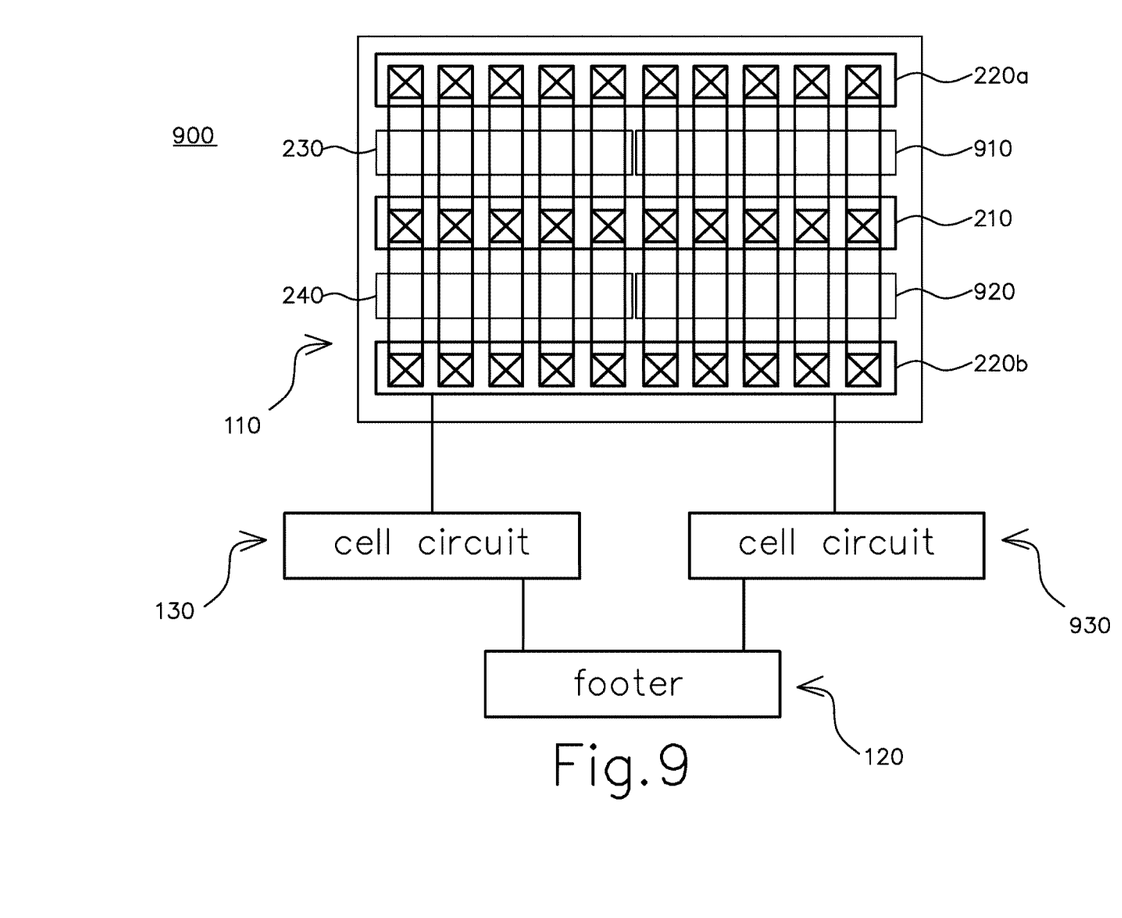
FIG. 9 is a schematic view illustrating another exemplary structure/layout of the cell in accordance with some embodiments.

FIG. 9 is a schematic view illustrating another exemplary structure/layout 900 of the cell of the semiconductor device 100 in accordance with some embodiments. This embodiment differs from the structure/layout 300 in that the structure/layout 900 further includes transistor units 910, 920 and a cell circuit 930. Each of the transistor units 910, 920 is configured to electrically connect a respective one of the virtual source voltage rails 220a, 220b to the true source voltage rail 210. The cell circuit 930 is coupled between the virtual source voltage rail 220b and the virtual reference voltage rail 260b. In an embodiment, the cell circuits 130, 930 are configured to perform the same circuit function. In another embodiment, the cell circuits 130, 930 are configured to perform different circuit functions. In some embodiments, the footer 120 has a layout/structure similar to the layout/structure 900. That is, in such some embodiments, the structure/layout 900 further includes transistor units, each of which is configured to electrically connect a respective one of the virtual reference voltage rails 260a, 260b to the true reference voltage rail 250. In other embodiments, the footer 120 has a different layout/structure, e.g., the layout/structure 300.

From the above description, the semiconductor device 100 of the present disclosure includes a cell that has a header 110, a footer 120, and a cell circuit 130 connected between the header 110 and the footer 120. The header 110 includes a true source voltage rail 210, a pair of virtual source voltage rails 220a, 220b, and a pair of transistor units, each of which is configured to electrically connect a respective one of the virtual source voltage rails 220a, 220b to the true source voltage rail 210. The construction as such permits a current of the semiconductor device 100 to be dispersed in a first direction, i.e., from the true source voltage rail 210 to the virtual source voltage rail 220a, and in a second direction, i.e., from the true source voltage rail 210 to the virtual source voltage rail 220b, thereby reducing a current density of the semiconductor device 100, whereby the electromigration is mitigated, lengthening an electromigration life of the semiconductor device 100.

In an exemplary embodiment, a semiconductor device comprises a substrate, first and second transistors, a pair of first source/drain regions, a pair of second source/drain regions, and a cell. Each of the first and second transistors includes first and second source/drain terminals. The first and second source/drain regions are formed over the substrate. Each of the first source/drain regions corresponds to the first source/drain terminal of a respective one of the first and second transistors. Each of the second source/drain regions corresponds to the second source/drain terminal of a respective one of the first and second transistors. The cell includes a first voltage rail, a pair of second voltage rails, and a cell circuit. The first voltage rail is coupled to the first source/drain regions and is configured to be coupled to an external power supply. Each of the second voltage rails is coupled to a respective one of the second source/drain regions and is configured to be coupled to the first voltage rail and to provide a cell voltage that corresponds to a voltage of the external power supply. The cell circuit is coupled to one of the second voltage rails.

In another exemplary embodiment, a method comprises: a first voltage rail of a cell of a semiconductor device receiving a voltage from a power supply external to the semiconductor device; coupling a pair of second voltage rails to the first voltage rail; the second voltage rails providing a cell voltage that corresponds to the voltage; and a cell circuit of the cell operating at the cell voltage.

In another exemplary embodiment, a layout of a semiconductor device comprises a cell that includes a first voltage rail, a pair of second voltage rails, first and second transistor units, and a cell circuit. The first transistor unit is coupled between the first voltage rail and one of the second voltage rails. The second transistor unit is coupled between the first voltage rail and the other of the second voltage rails. The cell circuit is coupled to one of the second voltage rails.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a first transistor of a first transistor unit and an adjacent pair of transistors of a second transistor unit, the first transistor being disposed between the adjacent pair of transistors, each transistor including first and second source/drain terminals;
   a pair of first source/drain regions formed over the substrate, each of the pair of the first source/drain regions corresponding to the first source/drain terminal of a respective one of the first transistor and the adjacent pair of transistors,
   a pair of second source/drain regions formed over the substrate, each of the pair of the second source/drain regions corresponding to the second source/drain terminal of a respective one of the first transistor and the adjacent pair of transistors; and
   a cell including
      a first voltage rail coupled to the pair of first source/drain regions and configured to be coupled to an external power supply,
      a pair of second voltage rails, each of which is coupled to a respective one of the pair of second source/drain regions, and each of which is configured to be coupled to the first voltage rail and to provide a cell voltage that corresponds to a first voltage of the external power supply; and
      a cell circuit coupled to one of the pair of second voltage rails.

2. The semiconductor device of claim 1, further comprising:
   a pair of channel regions formed over the substrate, each of the pair of channel regions corresponding to a channel of a respective one of the first transistor and adjacent pair of transistors; and
   a pair of gate regions, each of which is formed over a respective one of the pair of channel regions and each of which corresponds to a gate terminal of a respective one of the first transistor and the adjacent pair of transistors.

3. The semiconductor device of claim 1, further comprising:
   a pair of first source/drain contact regions, each of which is formed over a respective one of the pair of first source/drain regions;
   a pair of second source/drain contact regions, each of which is formed over a respective one of the pair of second source/drain regions;
   a pair of first via regions, each of which interconnects the first voltage rail and a respective one of the pair of first source/drain contact regions; and
   a pair of second via regions, each of which interconnects a respective one of the pair of second voltage rails and a respective one of the pair of second source/drain contact regions.

4. The semiconductor device of claim 1, wherein the first voltage rail and the pair of second voltage rails are substantially parallel to each other.

5. The semiconductor device of claim 1, wherein the first voltage rail and the pair of second voltage rails constitute a header of the cell, wherein the semiconductor device further comprising:
   a third transistor having first and second source/drain terminals; and
   a pair of third source/drain regions formed over the substrate, each of the pair of third source/drain regions corresponding to a respective one of the first and second source/drain terminals of the third transistor, wherein the cell further includes a footer that includes
      a first reference voltage rail coupled to one of the pair of third source/drain regions and configured to be coupled to the external power supply, and
      a second reference voltage rail coupled to the other of the pair of third source/drain regions and configured to be coupled to the first reference voltage rail and to provide a reference voltage that corresponds to a second voltage of the external power supply, wherein the cell circuit is further coupled to the second reference voltage rail.

6. The semiconductor device of claim 5, further comprising:
   a channel region formed over the substrate and corresponding to a channel of the third transistor; and
   a gate region formed over the channel region and corresponding to a gate terminal of the third transistor.

7. The semiconductor device of claim 5, further comprising:
   a pair of source/drain contact regions, each of which is formed over a respective one of the pair of third source/drain regions; and
   a pair of via regions, each of which interconnects a respective one of the first and second reference voltage rails and a respective one of the pair of source/drain contact regions.

8. The semiconductor device of claim 5, wherein the cell circuit is disposed between the header and the footer and configured to perform a predetermined logic function.

9. The semiconductor device of claim 1, wherein the first voltage rail and the pair of second voltage rails constitute a header of the cell, wherein the semiconductor device further comprising:
   third and fourth transistors, each of which has first and second source/drain terminals;
   a pair of third source/drain regions formed over the substrate, each of the pair of third source/drain regions corresponding to the first source/drain terminal of a respective one of the third and fourth transistors;
   a pair of fourth source/drain regions formed over the substrate, each of the pair of fourth source/drain regions corresponding to the second source/drain terminal of a respective one of the third and fourth transistors, wherein the cell further includes a footer that includes
      a first reference voltage rail coupled to the pair of third source/drain regions and configured to be coupled to the external power supply, and a pair of second reference voltage rails, each of which is coupled to a respective one of the pair of fourth source/drain regions, and each of which is configured to be coupled to the first reference voltage rail and to provide a cell voltage that corresponds to a second voltage of the external power supply, wherein the cell circuit is further coupled to one of the second reference voltage rails.

10. The semiconductor device of claim 9, further comprising:
a pair of channel regions formed over the substrate, each of the pair of the channel regions corresponding to a channel of a respective one of the third and fourth transistors; and
a pair of gate regions, each of which is formed over a respective one of the pair of channel regions and each of which corresponds to a gate terminal of a respective one of the third and fourth transistors.

11. The semiconductor device of claim 9, further comprising:
a pair of third source/drain contact regions, each of which is formed over a respective one of the pair of third source/drain regions;
a pair of fourth source/drain contact regions, each of which is formed over a respective one of the pair of fourth source/drain regions;
a pair of third via regions, each of which interconnects the first reference voltage rail and a respective one of the pair of third source/drain contact regions; and
a pair of fourth via regions, each of which interconnects a respective one of the pair of second reference voltage rails and a respective one of the pair of fourth source/drain contact regions.

12. A method comprising:
a first voltage rail of a cell of a semiconductor device receiving a first voltage from a power supply external to the semiconductor device, wherein the first voltage rail is coupled to a first transistor;
coupling a pair of second voltage rails of the cell to the first voltage rail by turning on an adjacent pair of transistors within the pair of second voltage rails, each of which is coupled between the first transistor and the adjacent pair of transistors;
the pair of second voltage rails providing a cell voltage that corresponds to the first voltage; and
a cell circuit of the cell operating at the cell voltage.

13. The method of claim 12, wherein the first voltage rail and the pair of second voltage rails constitute a header of the cell, the method further comprising:
a first reference voltage rail of a footer of the cell receiving a second voltage from the power supply;
coupling a second reference voltage rail of the footer to the first reference voltage rail; and
the second reference voltage rail providing to the cell circuit a reference voltage that corresponds to the second voltage.

14. The method of claim 13, further comprising coupling a pair of the second reference voltage rails to the first reference voltage rail.

15. The method of claim 13, wherein the cell circuit is disposed between the header and the footer and configured to perform a predetermined logic function.

16. A layout of a semiconductor device, comprising:
a cell including:
a first voltage rail;
a pair of second voltage rails;
a first transistor unit coupled between the first voltage rail and one of the pair of second voltage rails;
a second transistor unit coupled between the first voltage rail and the other of the pair of second voltage rails; and
a cell circuit coupled to one of the pair of second voltage rails
wherein a transistor of the first transistor unit is disposed between an adjacent pair of transistors of the second transistor unit.

17. The layout of claim 16, wherein the first and second transistor units have different numbers of transistors.

18. The layout of claim 16, further comprising a via interconnecting a transistor of the first transistor unit, a transistor of the second transistor unit, and the first voltage rail.

19. The layout of claim 16, wherein the first voltage rail includes a pair of strips and each of the first and second transistor units is coupled to a respective one of the pair of strips.

20. The layout of claim 16, further comprising:
third and fourth transistor units, each of which is coupled between the first voltage rail and a respective one of the pair of second voltage rails; and
a second cell circuit coupled to one of the pair of second voltage rails.

* * * * *